United States Patent
Sasaki

(10) Patent No.: US 8,339,750 B2
(45) Date of Patent: Dec. 25, 2012

(54) SPIN ACCUMULATION MAGNETIC SENSOR

(75) Inventor: Tomoyuki Sasaki, Tokyo (JP)

(73) Assignee: TDK Corporation, Tokyo (JP)

( * ) Notice: Subject to any disclaimer, the term of this patent is extended or adjusted under 35 U.S.C. 154(b) by 799 days.

(21) Appl. No.: 12/471,909

(22) Filed: May 26, 2009

(65) Prior Publication Data
US 2009/0310263 A1 Dec. 17, 2009

(30) Foreign Application Priority Data
Jun. 11, 2008 (JP) ................................. 2008-153409

(51) Int. Cl.
G11B 5/33 (2006.01)
G11B 5/127 (2006.01)

(52) U.S. Cl. .................................. 360/319; 360/324.12

(58) Field of Classification Search ......................... None
See application file for complete search history.

(56) References Cited

U.S. PATENT DOCUMENTS

| | | | |
|---|---|---|---|
| 7,209,328 B2* | 4/2007 | Ito et al. ..................... 360/324.2 |
| 7,253,995 B2* | 8/2007 | Takahashi et al. .......... 360/324.2 |
| 7,280,322 B2 | 10/2007 | Takahashi et al. |
| 7,298,597 B2* | 11/2007 | Carey et al. ................ 360/324.2 |
| 7,349,186 B2 | 3/2008 | Ito |
| 7,492,631 B1* | 2/2009 | Assefa et al. ................. 365/171 |
| 7,522,392 B2 | 4/2009 | Carey et al. |
| 7,598,578 B2 | 10/2009 | Nakamura et al. |
| 7,678,475 B2* | 3/2010 | Slavin et al. .................. 428/811 |
| 7,755,928 B2 | 7/2010 | Anezaki et al. |
| 7,755,929 B2* | 7/2010 | Inomata et al. ............... 365/158 |
| 8,085,513 B2* | 12/2011 | Sasaki ........................ 360/324.2 |
| 2005/0111138 A1 | 5/2005 | Yamakawa et al. |
| 2006/0262458 A1* | 11/2006 | Carey et al. ................ 360/324.2 |
| 2007/0127162 A1 | 6/2007 | Nishiyama et al. |
| 2007/0253116 A1* | 11/2007 | Takahashi .................... 360/313 |
| 2007/0253121 A1 | 11/2007 | Yamada et al. |

FOREIGN PATENT DOCUMENTS

| | | |
|---|---|---|
| EP | 1 052 520 B1 | 7/2005 |
| JP | A-2000-323767 | 11/2000 |
| JP | A-2003-008105 | 1/2003 |
| JP | A-2005-209248 | 8/2005 |
| JP | A-2007-088068 | 4/2007 |
| JP | A-2007-157252 | 6/2007 |

(Continued)

OTHER PUBLICATIONS

U.S. Appl. No. 12/471,995, filed May 26, 2009 in the name of Tomoyuki Sasaki.

(Continued)

*Primary Examiner* — Kevin Bernatz
(74) *Attorney, Agent, or Firm* — Oliff & Berridge, PLC

(57) ABSTRACT

A magnetic sensor comprises a nonmagnetic conductive layer, a free magnetization layer disposed on a first part of the nonmagnetic conductive layer, a fixed magnetization layer disposed on a second part of the nonmagnetic conductive layer different from the first part, upper and lower first magnetic shield layers opposing each other through the nonmagnetic conductive layer and free magnetization layer interposed therebetween, upper and lower second magnetic shield layers opposing each other through the nonmagnetic conductive layer and fixed magnetization layer interposed therebetween, and an electrically insulating layer disposed between the lower second magnetic shield layer and the nonmagnetic conductive layer, while the lower first magnetic shield layer is arranged closer to the nonmagnetic conductive layer than is the lower second magnetic shield layer.

13 Claims, 5 Drawing Sheets

FOREIGN PATENT DOCUMENTS

| JP | A-2007-294710 | 11/2007 |
|---|---|---|
| JP | A-2007-299467 | 11/2007 |
| JP | B2-4029772 | 1/2008 |

OTHER PUBLICATIONS

U.S. Appl. No. 12/471,804, filed May 26, 2009 in the name of Tomoyuki Sasaki.
U.S. Appl. No. 12/608,583, filed Oct. 29, 2009 in the name of Tomoyuki Sasaki.
Sep. 29, 2011 Office Action issued in U.S. Appl. No. 12/471,804.
Sep. 30, 2011 Office Action issued in U.S. Appl. No. 12/471,995.
Oct. 11, 2011 Notice of Allowance issued in U.S. Appl. No. 12/608,583.
Mar. 19, 2012 Office Action issued in U.S. Appl. No. 12/471,804.
Feb. 7, 2012 Office Action issued in U.S. Appl. No. 12/471,995.

* cited by examiner

SPIN ACCUMULATION MAGNETIC SENSOR

BACKGROUND OF THE INVENTION

1. Field of the Invention

The present invention relates to a magnetic sensor.

2. Related Background Art

As magnetic sensors used in thin-film magnetic recording and reproducing heads and the like, magnetoresistive (MR) devices utilizing giant magnetoresistive effect (GMR), tunnel magnetoresistive effect (TMR), and the like have conventionally been known.

In general, a GMR device has a multilayer structure in which a free magnetization layer, a nonmagnetic conductive layer, a fixed magnetization layer, and an upper electrode are sequentially formed on a lower electrode. A typical TMR device has a multilayer structure in which a free magnetization layer, a nonmagnetic insulating barrier layer, a fixed magnetization layer, and an upper electrode are sequentially formed on a lower electrode. Such a magnetoresistive device in which a free magnetization layer and a fixed magnetization layer are laminated in a vertical direction will hereinafter be referred to as vertical spin-valve device. For measuring a magnetic field from a minute area, it has been desired for the vertical spin-valve device to lower the height in the laminating direction.

On the other hand, a spin accumulation (SA) magnetic sensor in which a free magnetization layer and a fixed magnetization layer are formed on the same horizontal surface (nonmagnetic conductive layer for accumulating spins) has been known (see, for example, Japanese Patent Application Laid-Open No. 2007-299467 and Japanese Patent Publication No. 4029772), which will hereinafter be referred to as lateral spin-valve device.

SUMMARY OF THE INVENTION

The lateral spin-valve device is advantageous over the vertical spin-valve device in that the height in the laminating direction can be made lower because of its structure. In the conventional lateral spin-valve device, however, an electrically insulating layer for electrically insulating a nonmagnetic conductive layer where spins accumulate and a lower magnetic shield layer disposed under the nonmagnetic conductive layer from each other is provided between the nonmagnetic conductive layer and lower magnetic shield layer. This increases the height in the laminating direction by the thickness of the electrically insulating layer, thereby inhibiting the magnetic sensor from improving its resolution.

In view of circumstances mentioned above, it is an object of the present invention to provide a magnetic sensor which can improve the resolution.

For achieving the above-mentioned object, the magnetic sensor of the present invention comprises a nonmagnetic conductive layer, a free magnetization layer disposed on a first part of the nonmagnetic conductive layer, a fixed magnetization layer disposed on a second part of the nonmagnetic conductive layer different from the first part, upper and lower first magnetic shield layers opposing each other through the nonmagnetic conductive layer and free magnetization layer interposed therebetween, upper and lower second magnetic shield layers opposing each other through the nonmagnetic conductive layer and fixed magnetization layer interposed therebetween, and an electrically insulating layer disposed between the lower second magnetic shield layer and the nonmagnetic conductive layer, wherein the lower first magnetic shield layer is arranged closer to the nonmagnetic conductive layer than is the lower second magnetic shield layer.

Since the lower first magnetic shield layer is arranged closer to the nonmagnetic conductive layer than is the lower second magnetic shield layer, the magnetic sensor of the present invention can reduce the gap between the upper and lower first magnetic shield layers sandwiching the free magnetization layer. This can improve the resolution of the magnetic sensor.

Preferably, in the magnetic sensor of the present invention, the lower first magnetic shield layer is in contact with the nonmagnetic conductive layer. This can further reduce the gap between the upper and lower first magnetic shield layers sandwiching the free magnetization layer and improve the resolution of the magnetic sensor.

Preferably, in the magnetic sensor of the present invention, the upper first magnetic shield layer is arranged closer to the nonmagnetic conductive layer than is the upper second magnetic shield layer.

This can further reduce the gap between the upper and lower first magnetic shield layers sandwiching the free magnetization layer and improve the resolution of the magnetic sensor. This is effective in particular when the distance between the nonmagnetic conductive layer and the upper second magnetic shield layer is greater, e.g., when an antiferromagnetic layer exists on the fixed magnetization layer.

Preferably, in the magnetic sensor of the present invention, the upper first magnetic shield layer is in contact with the free magnetization layer.

This can further improve the resolution of the magnetic sensor. The upper first magnetic shield layer can also be used as an electrode.

Preferably, in the magnetic sensor of the present invention, the lower first and second magnetic shield layers are provided independently from each other.

This makes it possible to use the lower first magnetic shield layer as an electrode for measuring a voltage occurring at an interface between the free magnetization layer and nonmagnetic conductive layer, and the lower second magnetic shield layer as an electrode for injecting spins into the nonmagnetic conductive layer.

Preferably, in the magnetic sensor of the present invention, the upper first and second magnetic shield layers are provided independently from each other.

This makes it possible to use the upper first magnetic shield layer as an electrode for measuring a voltage occurring at an interface between the free magnetization layer and nonmagnetic conductive layer, and the upper second magnetic shield layer as an electrode for injecting spins into the nonmagnetic conductive layer.

Preferably, the magnetic sensor of the present invention further comprises a permanent magnet for applying a bias magnetic field to the free magnetization layer.

This regulates the magnetic anisotropy of the free magnetization layer, so that the domain structure of the free magnetization layer becomes unified and stabilized, whereby Barkhausen noise can be restrained from being caused by domain wall movements.

Preferably, in the magnetic sensor of the present invention, the fixed magnetization layer has a direction of magnetization fixed by at least one of an antiferromagnetic layer disposed on the fixed magnetization layer and a shape anisotropy of the fixed magnetization layer.

When fixed by an antiferromagnetic layer disposed on the fixed magnetization layer or a shape anisotropy of the fixed magnetization layer, the direction of magnetization of the fixed magnetization layer is easily made less susceptible to external magnetic fields.

Preferably, in the magnetic sensor of the present invention, the free magnetization layer is arranged on a side where a magnetic flux of the nonmagnetic conductive layer enters, while the fixed magnetization layer is arranged on a side opposite from the side where the magnetic flux of the nonmagnetic conductive layer enters.

In this case, when the free magnetization layer arranged on the side opposite from the fixed magnetization layer is placed closer to a magnetic recording medium, magnetic information of the recording medium can be detected and reproduced.

Preferably, in the magnetic sensor of the present invention, the free magnetization layer and fixed magnetization layer are made of a metal selected from the group consisting of Cr, Mn, Co, Fe, and Ni, an alloy containing at least one metal in the group, or an alloy containing at least one metal selected from the group and at least one of B, C, and N.

These materials are soft magnetic materials and thus can favorably materialize the free magnetization layer in the magnetic sensor. These materials are also ferromagnetic materials having high spin polarizabilities and thus can favorably materialize the fixed magnetization layer in the magnetic sensor.

Preferably, in the magnetic sensor of the present invention, the nonmagnetic conductive layer is made of a material containing at least one element selected from the group consisting of B, C, Mg, Al, and Cu.

These materials have long spin-diffusion lengths and relatively low electric conductivities and thus can favorably materialize a spin accumulation layer.

It will also be preferred in the magnetic sensor of the present invention if the nonmagnetic conductive layer is made of a semiconductor compound containing Si or ZnO.

These semiconductor compounds have further longer spin-diffusion lengths and thus are more preferred as the spin accumulation layer, while being able to yield an output higher than that of the nonmagnetic conductive layer using the above-mentioned metals and alloys.

The present invention can provide a magnetic sensor which can lower the height in the laminating direction, so as to achieve a smaller size, thereby improving the resolution.

BRIEF DESCRIPTION OF THE DRAWINGS

FIG. 1 is a schematic view illustrating a thin-film magnetic recording and reproducing head 100A equipped with a magnetic sensor 100a;

FIG. 3 is a schematic view for explaining an operation in the magnetic sensor 100a;

DESCRIPTION OF THE PREFERRED EMBODIMENTS

Figure 1:
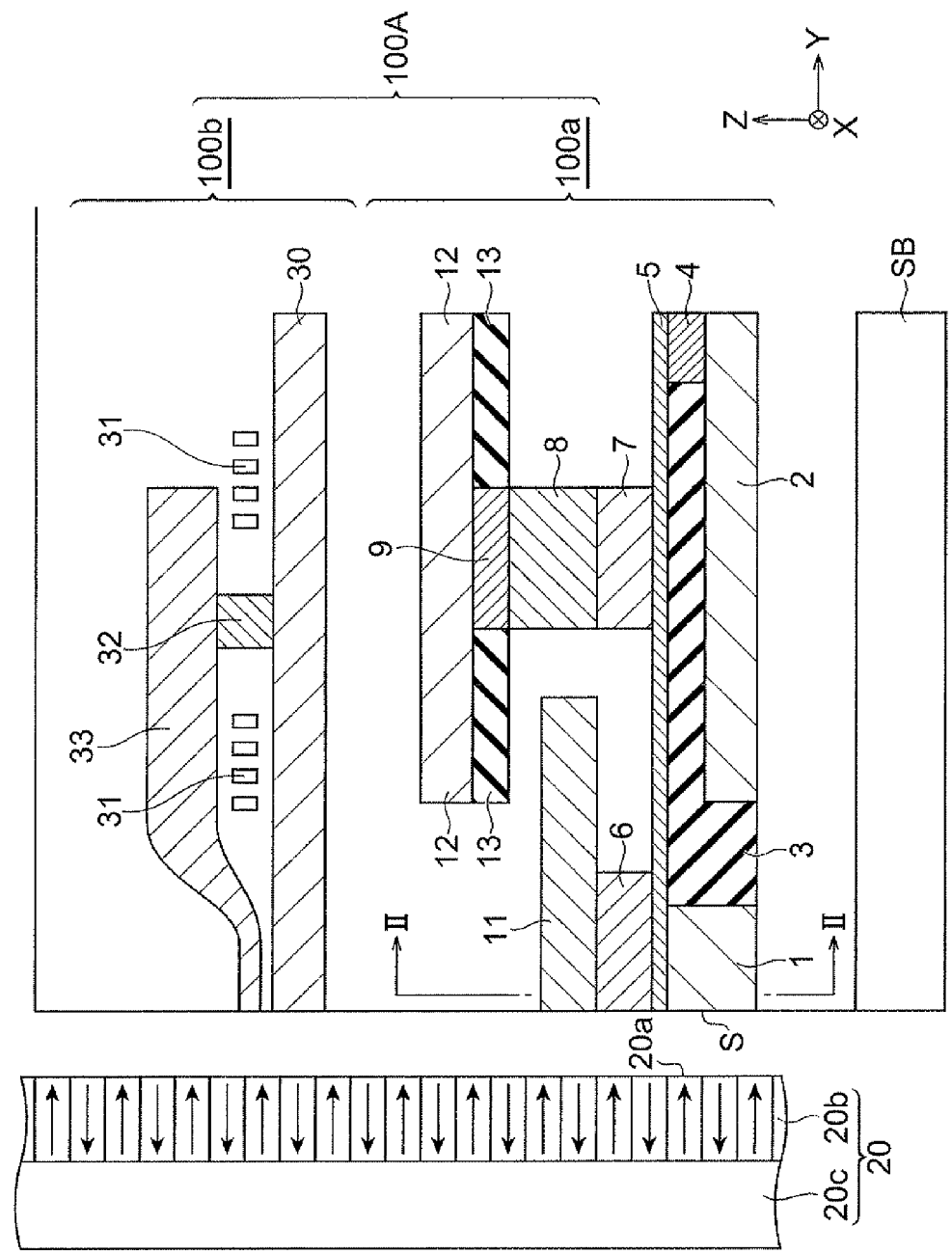

In the following, embodiments of the present invention will be explained in detail with reference to the accompanying drawings. In the explanation of the drawings, the same constituents will be referred to with the same signs while omitting their overlapping descriptions. Ratios of dimensions in the drawings do not always coincide with those in practice.

First Embodiment

A thin-film magnetic recording and reproducing head 100A will now be explained as an example of the magnetic sensor in accordance with the first embodiment.

FIG. 1 is a partial sectional view illustrating the thin-film magnetic recording and reproducing head 100A.

The thin-film magnetic recording and reproducing head 100A carries out operations for recording and reading magnetic information at such a potion that its air bearing surface (ABS) S opposes a recording surface 20a of a magnetic recording medium 20.

The magnetic recording medium 20, which includes a recording layer 20b having the recording surface 20a and a soft magnetic backing layer 20c laminated on the recording layer 20b, advances in the direction of Z in the drawing relative to the thin-film magnetic recording and reproducing head 100A.

The thin-film magnetic recording and reproducing head 100A comprises a magnetic sensor 100a for reading records from the magnetic recording medium 20 and a magnetic recording part 100b for recording onto the magnetic recording medium 20. The magnetic sensor 100a and magnetic recording part 100b are disposed on a substrate SB and covered with a nonmagnetic insulating layer made of alumina or the like.

As illustrated in FIG. 1, the magnetic recording part 100b is disposed on the magnetic sensor 100a. In the magnetic recording part 100b a contact part 32 and a main magnetic pole 33 are provided on a return yoke 30, so as to form a magnetic flux path. A thin-film coil 31 is provided so as to surround the contact part 32. When a recording current is caused to flow through the thin-film coil 31, a magnetic flux is released from the leading end of the main magnetic pole 33, whereby information can be recorded on the recording layer 20b of the magnetic recording medium 20 such as a hard disk.

The magnetic sensor 100a mainly comprises a nonmagnetic conductive layer 5 for accumulating spins of electrons, a free magnetization layer 6 disposed on a first part of the nonmagnetic conductive layer 5, a fixed magnetization layer 7 disposed on a second part of the nonmagnetic conductive layer 5 different from the first part, an upper first magnetic shield layer 11 and a lower first magnetic shield layer 1 which oppose each other while holding the nonmagnetic conductive layer 5 and free magnetization layer 6 therebetween, an upper second magnetic shield layer 12 and a lower second magnetic shield layer 2 which oppose each other while holding the nonmagnetic conductive layer 5 and fixed magnetization layer 7 therebetween, and an electrically insulating layer 3 disposed between the lower second magnetic shield layer 2 and nonmagnetic conductive layer 5.

The nonmagnetic conductive layer 5, which is a layer accumulating spins by spin injections, is disposed on a plane formed by the lower first magnetic shield layer 1 and electrically insulating layer 3. A nonferromagnetic conductive material is used for making the nonmagnetic conductive layer 5. As a material for the nonmagnetic conductive layer 5, one having a long spin-diffusion length and a relatively low electric conductivity is preferably selected.

An example of the material for the nonmagnetic conductive layer 5 contains at least one element selected from the group consisting of B, C, Mg, Al, and Cu. More specific examples include Cu and $MgB_2$. Other examples of the material for the nonmagnetic conductive layer 5 include semiconductor compounds such as Si, ZnO, and GaAs. Since these semiconductor compounds have further longer spin-diffusion lengths and relatively low electric conductivities, the nonmagnetic conductive layer 5 using these semiconductor compounds is more favorable as a spin accumulation layer and can yield an output higher than that of the nonmagnetic conductive layer 5 using the above-mentioned metals and their alloys.

The free magnetization layer 6 is a layer for detecting an external magnetic field and sharply sensing a change in the direction of magnetization of the magnetic recording medium 20 and the like. The free magnetization layer 6 is arranged on the upper face of the nonmagnetic conductive layer 5 on a side where the magnetic flux of the nonmagnetic conductive layer 5 enters, i.e., on the air bearing surface S side. When the free magnetization layer 6 is placed close to the magnetic recording medium 20, magnetic information can favorably be read from the medium 20. As the free magnetization layer 6, a ferromagnetic material, such as a soft magnetic material in particular, is employed, examples of which include metals selected from the group consisting of Cr, Mn, Co, Fe, and Ni, alloys containing at least one of the metals in the above-mentioned group, and alloys containing at least one metal selected from the above-mentioned group and at least one of B, C, and N. Specific examples include CoFeB and NiFe.

The fixed magnetization layer 7 is a layer for injecting electrons having predetermined spins into the nonmagnetic conductive layer 5. The fixed magnetization layer 7 is arranged on the upper face of the nonmagnetic conductive layer 5 on a side opposite from the side where the magnetic flux of the nonmagnetic conductive layer 5 enters, i.e., on the side remote from the air bearing surface S. As a material for the fixed magnetization layer 7, a ferromagnetic metal material having a high spin polarizability can be used, examples of which include metals selected from the group consisting of Cr, Mn, Co, Fe, and Ni, alloys containing at least one element in the above-mentioned group, and alloys containing at least one element selected from the above-mentioned group and at least one element selected from the group consisting of B, C, and N. Specific examples include CoFe and FeMn.

The fixed magnetization layer 7 has a coercive force greater than that of the free magnetization layer 6. Preferably, the magnetization of the fixed magnetization layer 7 is fixed by at least one of a magnetization fixing method using an antiferromagnetic layer 8 which will be explained later and a magnetization fixing method based on the shape anisotropy of the fixed magnetization layer 7. This can make the direction of magnetization of the fixed magnetization layer 7 less susceptible to external magnetic fields.

When the magnetization fixing method using the antiferromagnetic layer 8 is employed as a method of fixing the magnetization of the fixed magnetization layer 7, the antiferromagnetic layer 8 is disposed on the fixed magnetization layer 7. When the antiferromagnetic layer 8 is exchange-coupled with the fixed magnetization layer 7, the direction of magnetization of the fixed magnetization layer 7 can be fixed provided with a unidirectional anisotropy). This allows the fixed magnetization layer 7 to have a higher coercive force in one direction than when there is no antiferromagnetic layer 8. Therefore, the material used in the antiferromagnetic layer 8 is selected according to the material used in the fixed magnetization layer 7. Examples of the material for the antiferromagnetic layer 8 include alloys exhibiting antiferromagnetism which use Mn, specific examples of which include alloys containing n and at least one element selected from the group consisting of Pt, Ir, Fe, Ru, Cr, Pd, and Ni. More specific examples include IrMn and PtMn.

Figure 2A:
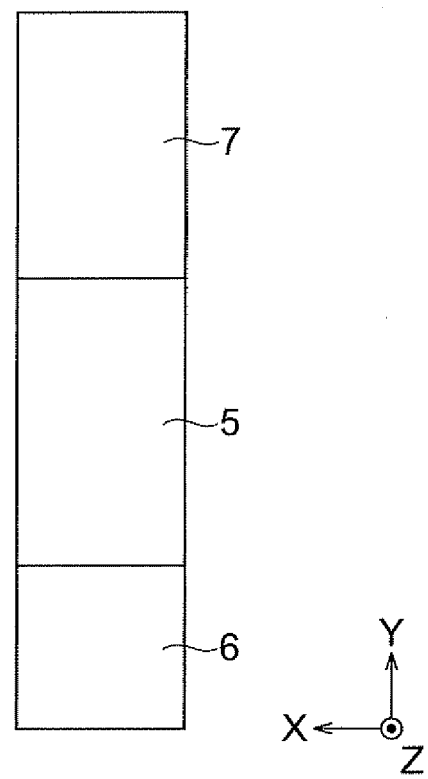
FIG. 2A is a schematic view illustrating a fixed magnetization layer, a free magnetization layer, and a nonmagnetic conductive layer when seen from the Z direction.

On the other hand, the antiferromagnetic layer 8 can be omitted when employing a method of fixing the magnetization of the fixed magnetization layer 7 by imparting a shape anisotropy thereto. For example, as shown in FIG. 2A, the fixed magnetization layer 7 may be shaped into a rectangular form having a longer axis in the Y direction when seen from the Z direction. The magnetization may be fixed by both of the antiferromagnetic layer 8 and the shape anisotropy as a matter of course.

The second electrode 9 is a layer for electrically connecting the upper second magnetic shield layer 12 and the antiferromagnetic layer 8 to each other in order for the upper second magnetic shield layer 12 to serve as an electrode such that a current flows into the fixed magnetization layer 7. When there is no antiferromagnetic layer 8, the second electrode 9 comes into contact with the fixed magnetization layer 7. The second electrode 9 is also effective in suppressing the atomic diffusion between the upper second magnetic shield layer 12 and the antiferromagnetic layer 8 or fixed magnetization layer 7 and the like. The present invention can also be carried out when the upper second magnetic shield layer 12 is in contact with the antiferromagnetic layer 8 or fixed magnetization layer 7 without the second electrode 9.

Examples of the material for the second electrode 9 include metal materials such as Cr and Al.

The upper first magnetic shield layer 11 and upper second magnetic shield layer 12 constitute an upper magnetic shield layer and respectively block magnetisms from invading the free magnetization layer 6 and fixed magnetization layer 7 from the outside, from above the magnetic sensor 100a in particular. Preferably, the upper first magnetic shield layer 11 is arranged closer to the nonmagnetic conductive layer 5 than is the upper second magnetic shield layer 12. Preferably, the upper first magnetic shield layer 11 is in contact with the free magnetization layer 6. As for the fixed magnetization layer 7, the distance between the nonmagnetic conductive layer 5 and upper second magnetic shield layer 12 tends to become greater because of the antiferromagnetic layer 8, the second electrode 9, and the like. When the upper first magnetic shield layer 11 is placed closer to the nonmagnetic conductive layer 5 than is the upper second magnetic shield layer 12, however, the distance between the upper first magnetic shield layer 11 and lower first magnetic shield layer 1 is easier to become narrower at the free magnetization layer 6.

As illustrated in FIG. 1, the upper first magnetic shield layer 11 is formed on the free magnetization layer 6. On the other hand, the upper second magnetic shield layer 12 is formed on a layer structure composed of the fixed magnetization layer 7, antiferromagnetic layer 8, and second electrode 9. In this embodiment, the upper first magnetic shield layer 11 and upper second magnetic shield layer 12 are provided independently from each other. Consequently, the upper first magnetic shield layer 11 and upper second magnetic shield layer 12 can be utilized as electrodes for the free magnetization layer 6 and fixed magnetization layer 7, respectively.

The lower first magnetic shield layer 1 and lower second magnetic shield layer 2 constitute a lower magnetic shield layer and are used for respectively blocking magnetisms from invading the free magnetization layer 6 and fixed magnetization layer 7 from the outside, from under the magnetic sensor 100a in particular. The lower first magnetic shield layer 1 is arranged closer to the nonmagnetic conductive layer 5 than is the lower second magnetic shield layer 2. Preferably, as illustrated in FIG. 1, the lower first magnetic shield layer 1 is in contact with the nonmagnetic conductive layer 5. Further, the lower first magnetic shield layer 1 and lower second magnetic shield layer 2 are provided independently from each other, since the first electrically insulating layer 3 is disposed therebetween.

Examples of materials for the lower first magnetic shield layer 1, lower second magnetic shield layer 2, upper first magnetic shield layer 11, and upper second magnetic shield layer 12 include soft magnetic materials such as alloys containing Ni and Fe, sendust, alloys containing Fe and Co, and alloys containing Fe, Co, and Ni.

The first electrically insulating layer 3 is disposed between the nonmagnetic conductive layer 5 and the second magnetic shield layer 2. The first electrically insulating layer 3 prevents spins of electrons accumulated in the nonmagnetic conductive layer 5 from flowing out toward the lower second magnetic shield layer 2. Preferably, from the viewpoint of efficiently accumulating the spins, the first electrically insulating layer 3 is provided on the lower face of the nonmagnetic conductive layer 5 so as to extend from the fixed magnetization layer 7 side to the free magnetization layer 6 side. Preferably, from the viewpoint of efficiently diffusing the spins from the fixed magnetization layer 7 to the free magnetization layer 6 side, the first electrically insulating layer 3 is disposed such as to overlap the free magnetization layer 6 through the nonmagnetic conductive layer 5.

The first electrically insulating layer 3 is also disposed between the lower first magnetic shield layer 1 and lower second magnetic shield layer 2, which are provided independently from each other. An example of the first electrically insulating layer 3 is $SiO_2$.

The first electrode 4 is an electrode for allowing a detection current to flow into the fixed magnetization layer 7. On the lower face of the nonmagnetic conductive layer 5, the first electrode 4 is disposed adjacent to the first electrically insulating layer 3 on the side opposite from the air bearing surface S. In FIG. 1, the nonmagnetic conductive layer 5 is electrically connected to the lower second magnetic shield layer 2 through the first electrode 4. Therefore, the lower second magnetic shield layer 2 disposed under the first electrode 4 can be used as an electrode for allowing the detection current to flow into the fixed magnetization layer 7. For example, metal materials such as Cu, Cr, and Al are used as the first electrode 4. The first electrode 4 can be omitted when the lower second magnetic shield layer 2 is not used as the electrode.

The second electrically insulating layer 13 is formed at both ends of the second electrode 9. An example of the second electrically insulating layer 13 is $SiO_2$. The second electrically insulating layer 13 can be omitted.

Figure 2B:
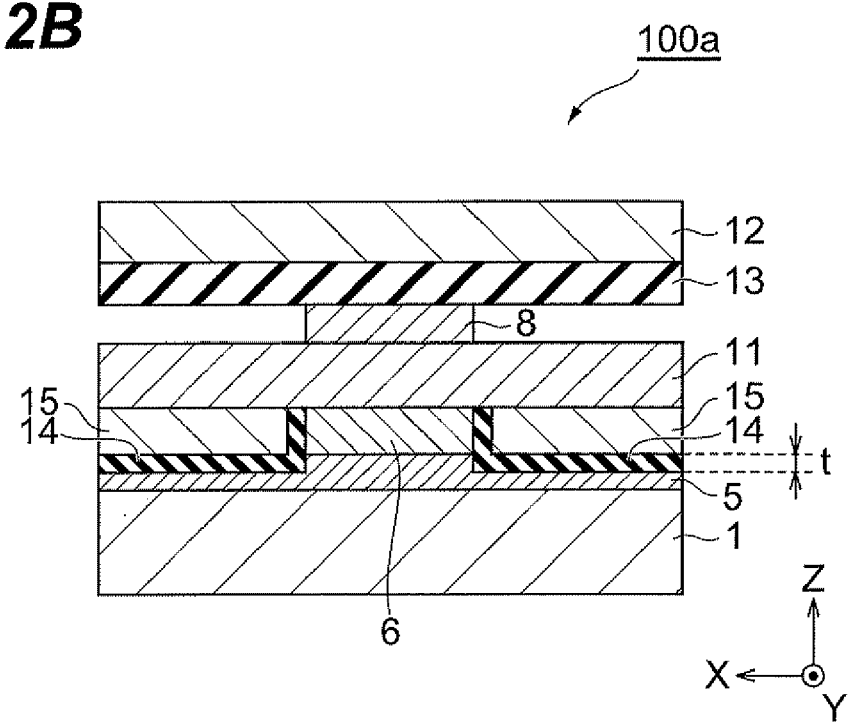
FIG. 2B is a schematic view for explaining a cross-sectional structure taken along the line II-II of FIG. 1.

A cross-sectional form of the magnetic sensor 100a parallel to the X direction illustrated in FIG. 1 will now be explained with reference to FIG. 2B. FIG. 2B is a schematic view for explaining the cross-sectional structure taken along the line II-II of FIG. 1.

Preferably, in the nonmagnetic conductive layer 5, the part disposed directly under the free magnetization layer 6 is thicker than the remaining part by the thickness t of a third electrically insulating layer 14, which will be explained later, as illustrated in FIG. 2B. This is for imparting the same thickness to the free magnetization layer 6 and a permanent magnet 15 which will be explained later, whereby the domain structure of the free magnetization layer 6 can be stabilized more uniformly.

The third electrically insulating layer 14 is provided between the permanent magnet 15 and the nonmagnetic conductive layer 5 and free magnetization layer 6 in order to insulate the nonmagnetic conductive layer 5 and free magnetization layer 6 from the permanent magnet 15. As the third electrically insulating layer 14, $SiO_2$ or the like is used.

The permanent magnet 15 is arranged on both sides of the free magnetization layer 6 with the third electrically insulating layer 14 interposed therebetween. Applying a bias magnetic field to the free magnetization layer 6 by using a leakage magnetic flux from the permanent magnet 15 can stabilize (uniaxially orient) the domain structure of the free magnetization layer 6. This can restrain Barkhausen noise from being caused by domain wall movements.

Figure 3:
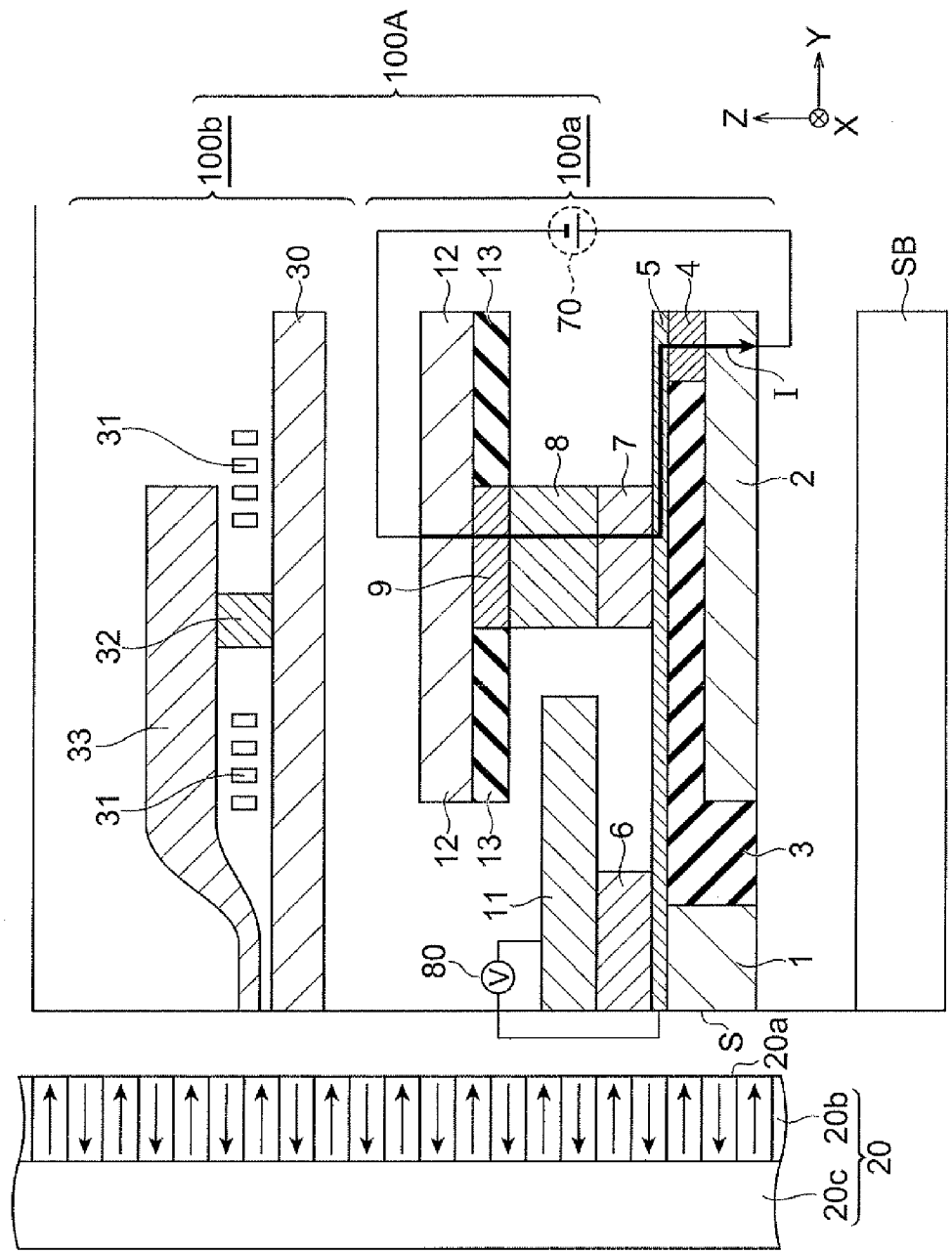

The operation of the magnetic sensor 100a in accordance with the first embodiment illustrated in FIG. 1 will now be explained with reference to FIG. 3.

In order for a detection current to flow into the fixed magnetization layer 7, the lower second magnetic shield layer 2 and the upper second magnetic shield layer 12 are electrically connected to a current source 70.

On the other hand, the nonmagnetic conductive layer 5 and upper first magnetic shield layer 11 are electrically connected to a voltmeter 80. When the upper first magnetic shield layer 11 is separated and insulated from the free magnetization layer 6, the nonmagnetic conductive layer 5 and free magnetization layer 6 may be electrically connected to the voltmeter 80.

First, a detection current I is caused to flow into the fixed magnetization layer 7 of the magnetic sensor 100a. For example, as illustrated in FIG. 3, the detection current I from the current source 70 is caused to flow through the upper second magnetic shield layer 12, second electrode 9, antiferromagnetic layer 8, fixed magnetization layer 7, nonmagnetic conductive layer 5, first electrode 4, and lower second magnetic shield layer 2 in this order.

When the detection current I thus flows from the fixed magnetization layer 7, which is a ferromagnetic body, into the nonmagnetic conductive layer 5, electrons having spins corresponding to the direction of magnetization of the fixed magnetization layer 7 flow into the nonmagnetic conductive layer 5 from the interface between the fixed magnetization layer 7 and nonmagnetic conductive layer 5 (spin injection). The spins further diffuse within the nonmagnetic conductive layer 5 from the fixed magnetization layer 7 side to the free magnetization layer 6 side.

According to the relative angle between the direction of magnetization of the free magnetization layer 6, which varies depending on external magnetic fields, and the direction of magnetization of the fixed magnetization layer 7, a variable voltage output occurs at the interface between the free magnetization layer 6 and the nonmagnetic conductive layer 5. The voltage occurring between the nonmagnetic conductive layer 5 and the upper first magnetic shield layer 11 is detected in this embodiment. Thus, the magnetic sensor 100a can be employed as an external magnetic field sensor.

Effects of the magnetic sensor 100a in accordance with the first embodiment will now be explained.

In the magnetic sensor 100a in accordance with the first embodiment, the lower first magnetic shield layer 1 is arranged closer to the nonmagnetic conductive layer 5 than is the lower second magnetic shield layer 2. As a consequence, the gap between the free magnetization layer 6 and the lower first magnetic shield layer 1 can be made smaller than that in the conventional magnetic sensor, whereby the gap between the upper first magnetic shield layer 11 and the lower first magnetic shield layer 1 can be reduced. This can narrow the gap between the upper first magnetic shield layer 11 and lower first magnetic shield layer 1 sandwiching the free magnetization layer 6, which serves as an indication of resolution, whereby the resolution of the magnetic sensor can be improved.

In particular, since the lower first magnetic shield layer 1 is in contact with the nonmagnetic conductive layer 5, the magnetic sensor 100a can further reduce the gap between the free magnetization layer 6 and the lower first magnetic shield layer 1 and improve the resolution of the magnetic sensor.

Since the upper first magnetic shield layer 11 is arranged closer to the nonmagnetic conductive layer 5 than is the upper second magnetic shield layer 12, the magnetic sensor 100a in accordance with the first embodiment can reduce the gap between the free magnetization layer 6 and the upper first magnetic shield layer 11, whereby the resolution of the magnetic sensor can further be improved.

Since the upper first magnetic shield layer 11 is in contact with the free magnetization layer 6, the magnetic sensor 100a in accordance with the first embodiment can further reduce the gap between the free magnetization layer 6 and the upper first magnetic shield layer 11, whereby the resolution of the magnetic sensor can further be improved.

Since the lower first magnetic shield layer 1 and the lower second magnetic shield layer 2 are provided independently from each other, the magnetic sensor 100a in accordance with the first embodiment can use the lower first magnetic shield layer 1 as an electrode for measuring the voltage occurring at the interface between the nonmagnetic conductive layer 5 and the free magnetization layer 6, and the lower second magnetic shield layer 2 as an electrode for injecting spins into the nonmagnetic conductive layer 5.

Since the upper first magnetic shield layer 11 and the upper second magnetic shield layer 12 are provided independently from each other, the magnetic sensor 100a in accordance with the first embodiment can use the upper first magnetic shield layer 11 as an electrode for measuring the voltage occurring at the interface between the nonmagnetic conductive layer 5 and the free magnetization layer 6, and the upper second magnetic shield layer 12 as an electrode for injecting spins into the nonmagnetic conductive layer 5.

Second Embodiment

A thin-film magnetic recording and reproducing head 100B as an example of the magnetic sensor in accordance with the second embodiment will now be explained.

Figure 4:
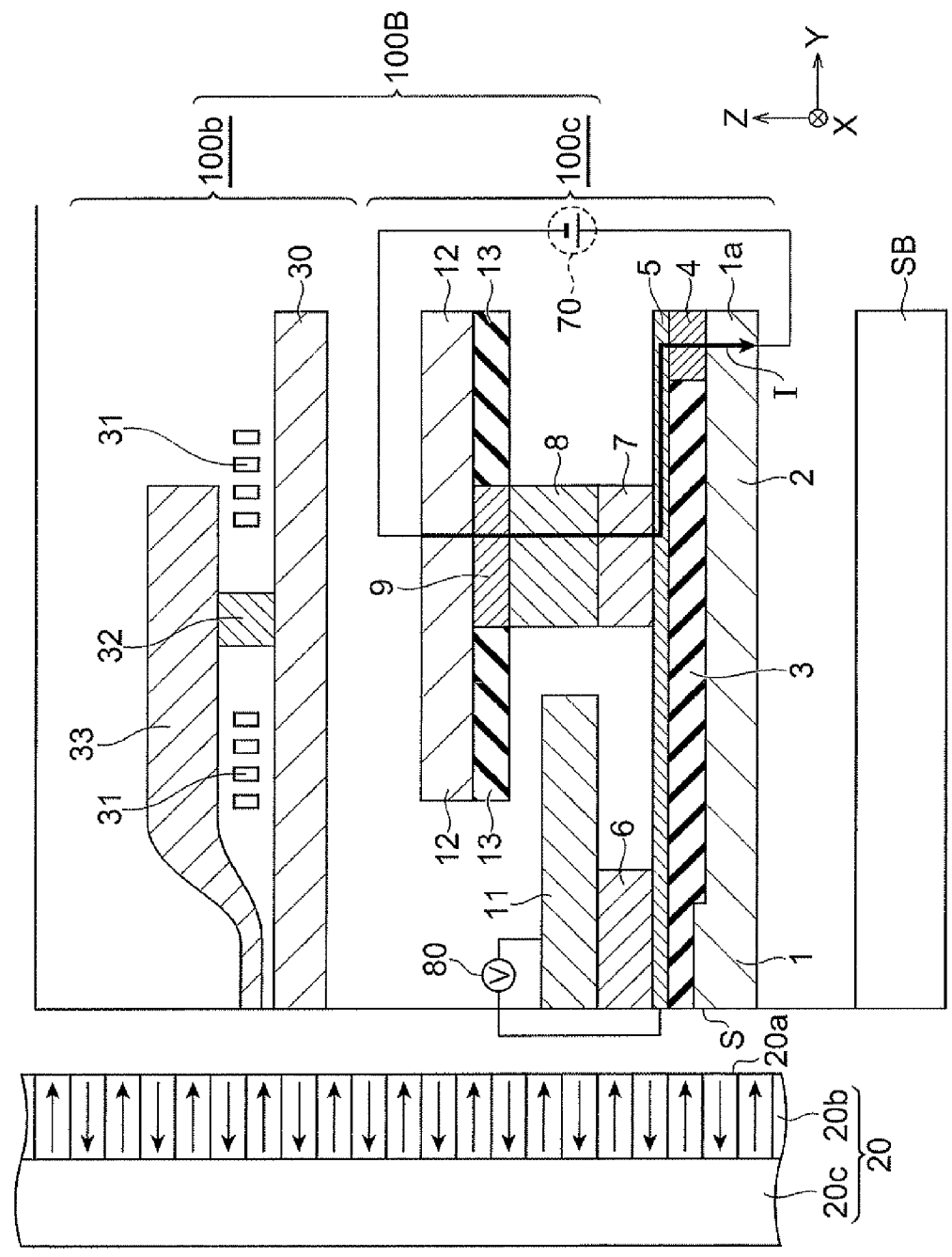
FIG. 4 is a schematic view for explaining a thin-film magnetic recording and reproducing head 100B equipped with a magnetic sensor 100c and an operation thereof.

FIG. 4 is a partial sectional view illustrating the thin-film magnetic recording and reproducing head 100B.

The thin-film magnetic recording and reproducing head 100B illustrated in FIG. 4 differs from the thin-film magnetic recording and reproducing head 100A in accordance with the first embodiment in terms of the lower first magnetic shield layer 1, lower second magnetic shield layer 2, and first electrically insulating layer 3, which will be explained alone.

In this embodiment, the lower first magnetic shield layer 1 and lower second magnetic shield layer 2 are formed integrally with each other and electrically connected to each other. The lower first magnetic shield layer 1 opposing the free magnetization layer 6 projects toward the nonmagnetic conductive layer 5 so as to be positioned closer to the nonmagnetic conductive layer 5 than is the lower second magnetic shield layer 2 opposing the fixed magnetization layer 7. However, the lower first magnetic shield layer 1 is not in contact with the nonmagnetic conductive layer 5, but is electrically insulated from the nonmagnetic conductive layer 5 by the first electrically insulating layer 3.

The magnetic sensor 100c in accordance with the second embodiment yields effects similar to those obtained by the magnetic sensor 100a in accordance with the first embodiment.

Third Embodiment

A thin-film magnetic recording and reproducing head 100C as an example of the magnetic sensor in accordance with the third embodiment will now be explained.

Figure 5:
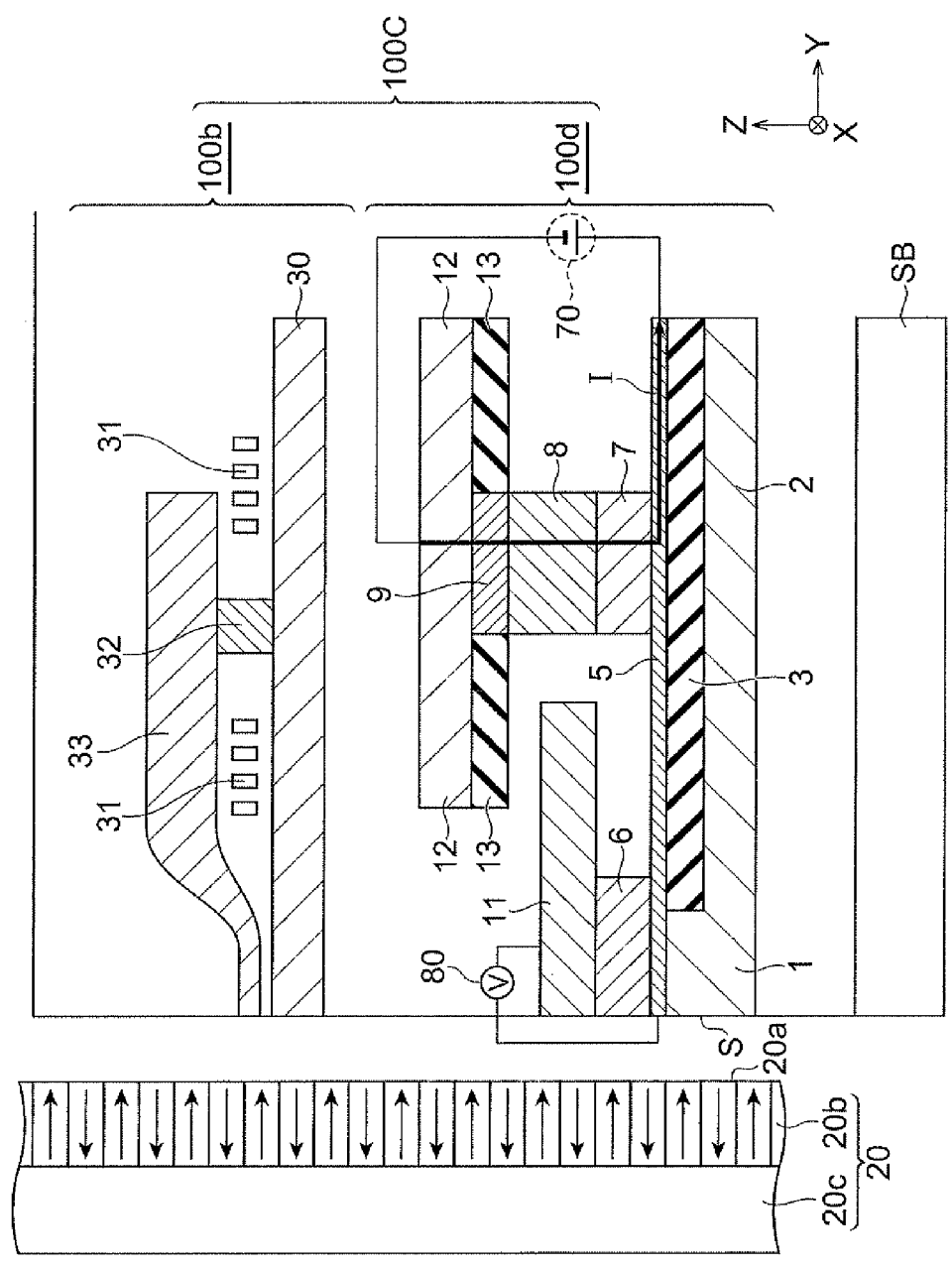
FIG. 5 is a schematic view for explaining a thin-film magnetic recording and reproducing head 100C equipped with a magnetic sensor 100d and an operation thereof.

FIG. 5 is a partial sectional view illustrating the thin-film magnetic recording and reproducing head 100C.

The thin-film magnetic recording and reproducing head 100C illustrated in FIG. 5 differs from the thin-film magnetic recording and reproducing head 100A in accordance with the first embodiment in terms of the lower first magnetic shield layer 1, lower second magnetic shield layer 2, first electrically insulating layer 3, and first electrode 4, which will be explained alone.

In this embodiment, the lower first magnetic shield layer 1 and lower second magnetic shield layer 2 are formed integrally with each other and electrically connected to each other. The lower first magnetic shield layer 1 opposing the free magnetization layer 6 projects toward the nonmagnetic conductive layer 5 so as to be positioned closer to the nonmagnetic conductive layer 5 than is the lower second magnetic shield layer 2 opposing the fixed magnetization layer 7. As in the first embodiment, the lower first magnetic shield layer 1 is in contact with the nonmagnetic conductive layer 5. This embodiment lacks the first electrode 4 electrically connecting the nonmagnetic conductive layer 5 and the lower second magnetic shield layer 2 to each other. The current source 70 is electrically connected to the nonmagnetic conductive layer 5 without the aid of the lower first magnetic shield layer 1 and lower second magnetic shield layer 2.

The magnetic sensor 100d in accordance with the third embodiment yields effects similar to those obtained by the magnetic sensor 100a in accordance with the first embodiment.

In particular, the lower first magnetic shield layer 1 and lower second magnetic shield layer 2 are formed integrally with each other and thus can be made easily.

Though each of the foregoing embodiments explains the magnetic sensor of the present invention by using an example in which it is applied to a thin-film magnetic recording and reproducing head, the magnetic sensor of the present invention is applicable not only to the thin-film magnetic recording and reproducing head, but also to various uses such as magnetic encoder apparatus employed in small robots, digital cameras, and inkjet printers, magnetic field measuring apparatus, and magnetism detecting apparatus, for example.

Though the above-mentioned embodiments relate to an example injecting the current into the fixed magnetization layer 7 and detecting the voltage caused by external magnetic fields in the free magnetization layer 6, the voltage caused by external magnetic fields may be detected in the fixed magnetization layer 7 while injecting the current into the free magnetization layer 6.

What is claimed is:

1. A magnetic sensor comprising:
   a nonmagnetic conductive layer;
   a free magnetization layer disposed on a first part of a surface of the nonmagnetic conductive layer proximate to a surface of the magnetic sensor;
   a fixed magnetization layer disposed on a second part of the surface of the nonmagnetic conductive layer different from the first part;

upper and lower first magnetic shield layers opposing each other through the nonmagnetic conductive layer and free magnetization layer interposed therebetween;

upper and lower second magnetic shield layers opposing each other through the nonmagnetic conductive layer and fixed magnetization layer interposed therebetween; and an electrically insulating layer disposed between the lower second magnetic shield layer and the nonmagnetic conductive layer;

wherein the lower first magnetic shield layer is arranged closer to the nonmagnetic conductive layer than is the lower second magnetic shield layer.

2. A magnetic sensor according to claim 1, wherein the lower first magnetic shield layer is in contact with the nonmagnetic conductive layer.

3. A magnetic sensor according to claim 1, wherein the upper first magnetic shield layer is arranged closer to the nonmagnetic conductive layer than is the upper second magnetic shield layer.

4. A magnetic sensor according to claim 1, wherein the upper first magnetic shield layer is in contact with the free magnetization layer.

5. A magnetic sensor according to claim 1, wherein the lower first and second magnetic shield layers are provided independently from each other.

6. A magnetic sensor according to claim 1, wherein the upper first and second magnetic shield layers are provided independently from each other.

7. A magnetic sensor according to claim 1, further comprising a permanent magnet for applying a bias magnetic field to the free magnetization layer.

8. A magnetic sensor according to claim 1, wherein the fixed magnetization layer has a direction of magnetization fixed by at least one of an antiferromagnetic layer disposed on the fixed magnetization layer and a shape anisotropy of the fixed magnetization layer.

9. A magnetic sensor according to claim 1, wherein the free magnetization layer is arranged on a side where a magnetic flux of the nonmagnetic conductive layer enters; and wherein the fixed magnetization layer is arranged on a side opposite from the side where the magnetic flux of the nonmagnetic conductive layer enters.

10. A magnetic sensor according to claim 1, wherein the free magnetization layer is made of a metal selected from the group consisting of Cr, Mn, Co, Fe, and Ni, an alloy containing at least one element in the group, or an alloy containing at least one element selected from the group and at least one of B, C, and N.

11. A magnetic sensor according to claim 1, wherein the fixed magnetization layer is made of a metal selected from the group consisting of Cr, Mn, Co, Fe, and Ni, an alloy containing at least one element in the group, or an alloy containing at least one element selected from the group and at least one of B, C, and N.

12. A magnetic sensor according to claim 1, wherein the nonmagnetic conductive layer is made of a material containing at least one element selected from the group consisting of B, C, Mg, Al, and Cu.

13. A magnetic sensor according to claim 1, wherein the nonmagnetic conductive layer is made of a semiconductor compound containing Si or ZnO.

* * * * *